United States Patent [19]

Hausmann et al.

[11] Patent Number: 5,206,591
[45] Date of Patent: Apr. 27, 1993

[54] METHOD FOR OBTAINING DATA IN PHASE-CONTRAST MR ANGIOGRAPHY

[75] Inventors: Richard Hausmann, Erlangen, Fed. Rep. of Germany; Gerhard Laub, Edison, N.J.

[73] Assignee: Siemens Aktiengesellschaft, Fed. Rep. of Germany

[21] Appl. No.: 781,796

[22] Filed: Oct. 23, 1991

[51] Int. Cl.$^5$ .................................... G01R 33/20
[52] U.S. Cl. .................................... 324/306
[58] Field of Search ............... 324/300, 306, 307, 309, 324/318, 322; 128/653.2, 653.5

[56] References Cited

U.S. PATENT DOCUMENTS 5,070,876  12/1991  Wright ........................ 128/653
5,133,357  7/1992   Dumoulin et al. ............ 324/306

Primary Examiner—Michael J. Tokar
Attorney, Agent, or Firm—Lawrence C. Edelman

[57] ABSTRACT

For obtaining data in phase contrast MR angiography, which data is sensitive to flow in a sample in three-orthogonal directions, a sequence with four steps is applied to a sample. In the first step, spins are flow encoded with a positive polarity in all three directions. During the three further steps, flow encoding is inverted in one direction and kept positive in all other directions, with the direction having the inverted polarity being different in all three of the further steps. A raw data set for each of the directions is obtained by complex subtraction of the signals obtained by one of the further steps and of the signals obtained by the first step.

7 Claims, 4 Drawing Sheets

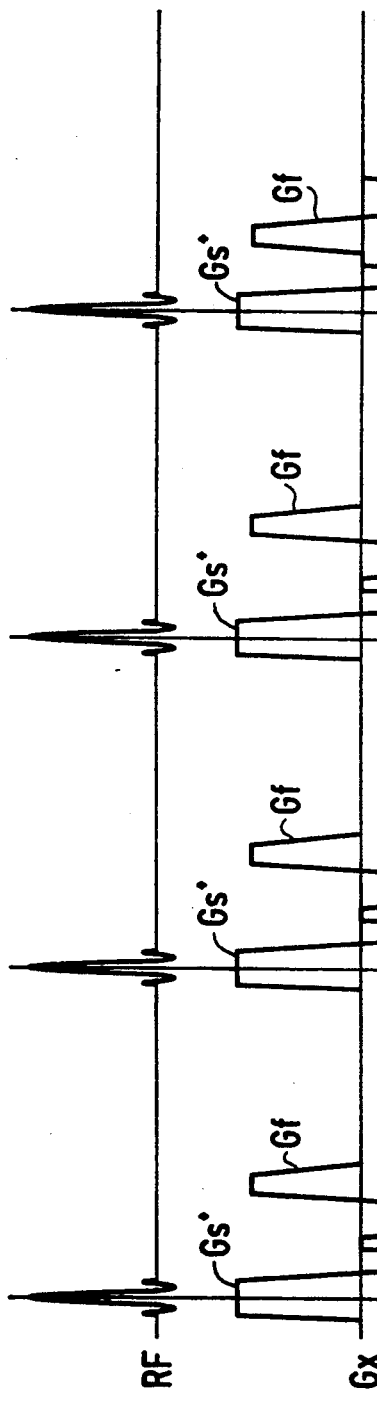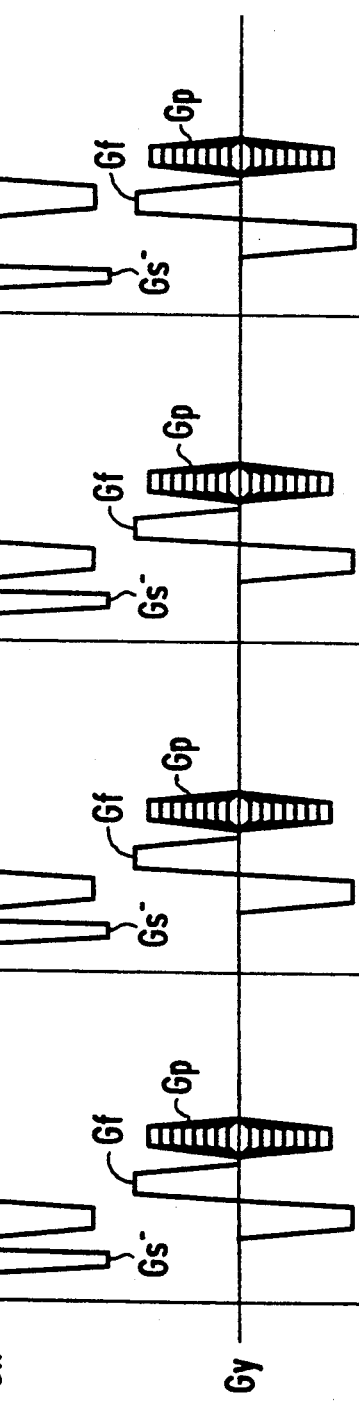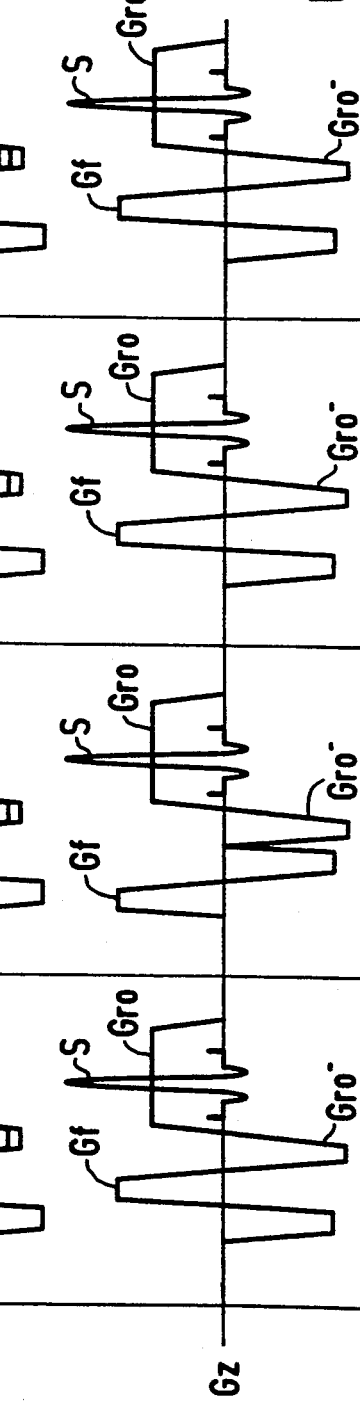

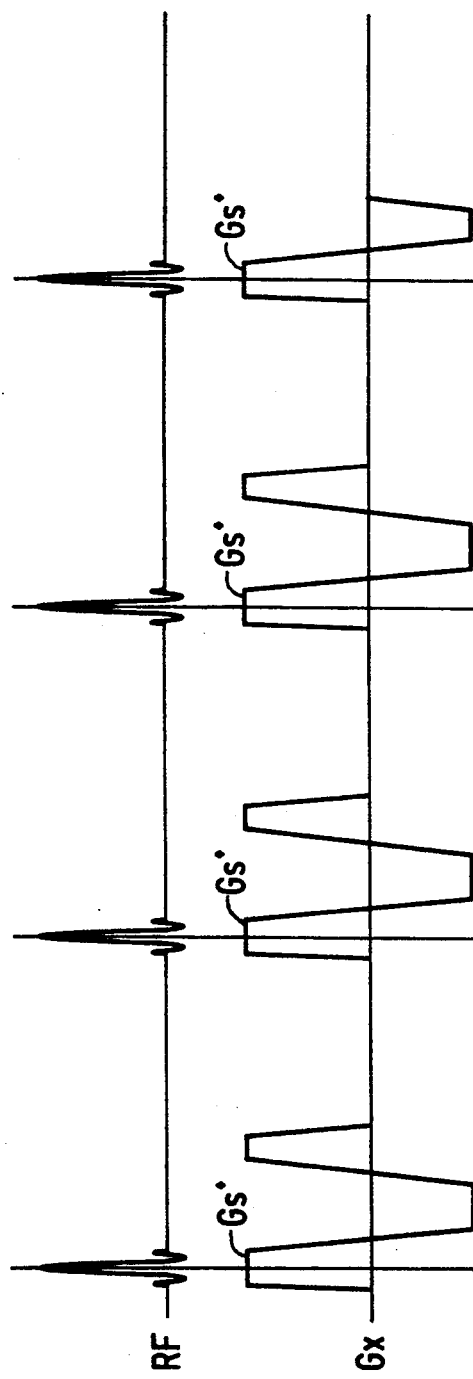

METHOD FOR OBTAINING DATA IN PHASE-CONTRAST MR ANGIOGRAPHY

BACKGROUND OF THE INVENTION

1. Field of the Invention

The present invention relates to a method for obtaining data in phase-contrast MR angiography which is sensitive to flow (movement) in three orthogonal directions. In particular, it relates to a method of reducing acquisition time and increasing sensitivity in phase-contrast MR angiography.

2. Description of Prior Art

Two basic physical principles can be used to acquire flow images with magnetic resonance (MR): time of flight and phase change effects. The first relies on signals from unsaturated flowing nuclear spins relative to saturated stationary background tissue.

Phase effects are based on the fact that spins moving along magnetic field gradients acquire a phase shift of their transverse magnetization that is directly related to the velocity of the flowing spins. Principles of this technique are described in an article entitled "A Flow Velocity Zeugmatrographic Interlace for NMR Imaging in Humans" by Paul A. Moran, Magnetic Resonance Imaging, Vol. 1, pp. 197 to 203, 1982.

A pulse sequence for producing an angiogram based on the net change in phase of moving spins was suggested by C. L. Dumoulin et al in Radiology 1986, 161 (pp. 717 to 720). In this sequence a flow-encoding gradient pulse is applied to a set of spins and then another pulse is applied some time later with reversed polarity. A spin that has not changed position along the axis of the flow-encoding gradient will experience no net change in phase. A spin that has moved along the axis of the gradient, however, will have a net change in phase. This change in phase can be measured by, for example, repeating the data acquiring pulse sequence without flow encoding gradient pulses or with inverted flow encoding gradient pulses. Taking the difference of the two sets of acquired data will result in cancellation of the signals from non-moving spins, since their signals are identical. Signals from moving spins, however, will have different phases in the two data sets and thus will be detected. The magnitude of the difference between the two sets of acquired data can be displayed as an angiogram wherein signal intensity is a function of blood flow in the flow sensitive direction. This known method is referred to as the phase-contrast method. However, a long acquisition time is necessary since two separate data sets must be acquired for each flow direction. If sensitivity in all three orthogonal directions is desired, it is required to take six measurements to produce the complete angiogram.

Similar methods are described by C. L. Dumoulin et al in an article entitled "Three-Dimensional Phase Contrast Angiography" in Magnetic Resonance in Medicine, 9, pp. 139 to 149, 1989.

According to a method described by R. Hausmann et al in the article "Reduction of Scan Time with a Modified Phase Contrast Acquisition Scheme" in Book of Abstracts, Vol. 1, page 402, Society of Magnetic Resonance in Medicine, Aug. 18 to 24, 1990, four sequences are performed in an interleaved manner. Three of the sequences are phase-sensitive to flow in three orthogonal directions and the forth sequence is flow compensated. A complex data set is obtained during each sequence. By taking the complex difference of each of the flow encoded data sets and the one flow compensated raw data set, signal from stationary tissue is cancelled. The subtracted data sets are Fourier-transformed, leading to three sets of flow magnitude images. These three data sets are then combined in a voxel-by-voxel method to obtain a 3D data set which is sensitive to flow in all three directions. This method provides short acquisition times. However, the signal-to-noise ratio of the acquired signals along each direction are not as good as those acquired by sequences which are simultaneously sensitive to spins in two directions, e.g., x,y and x,z.

A further method for obtaining signals for phase-contrast MR angiography is described by N. J. Pelc et al in Book of Abstracts, Vol. 1, page 475, Society of Magnetic Resonance in Medicine, Aug. 18 to 24, 1990. It also applies four sequences: the first sequence is a reference sequence, the second sequence encodes the spins in the x and y directions, the third in the x and z directions and the fourth in the y and z directions. Thus, these sequences are simultaneously sensitive to flow in two orthogonal directions.

It is an object of the present invention to provide a method for obtaining data in phase-contrast MR angiography which, with a short acquisition time, is sensitive to flow in three orthogonal directions.

It is a further object of the invention to provide a phase-contrast MR angiography method with high sensitivity to phase differences caused by flow of the nuclear spins.

It is still a further object of the invention to provide a phase-contrast MR angiography method which is insensitive to patient motion during measurement.

SUMMARY OF THE INVENTION

These and other objects of the invention are achieved by a method for obtaining data for phase-contrast MR angiography, which method is sensitive to flow in a sample in three orthogonal directions and comprises a sequence with four steps. A first step comprises excitation of spins in the sample and flow encoding the spins in a positive direction. In each of three further step the flow encoding of the spins is inverted in one of the orthogonal directions and positive in the other two directions, with the one direction being a different one of the three orthogonal directions in each of the three further steps. Additionally, the signals obtained during each of the above steps are sampled and a raw data set for each of the orthogonal directions is obtained by complex subtraction of the sampled signals from a respective one of said further steps and of the signals obtained by the first step.

BRIEF DESCRIPTION OF THE DRAWINGS

FIGS. 3, 4, 5, and 6 show MR pulse sequences 1, 2, 3, and 4, respectively;

FIGS. 7, 8, 9 and 10 show MR pulse sequences 1, 2, 3, and 4, respectively, wherein the flow encoding gradients are combined with other gradients.

DESCRIPTION OF A PREFERRED EMBODIMENT OF THE INVENTION

Figure 1:
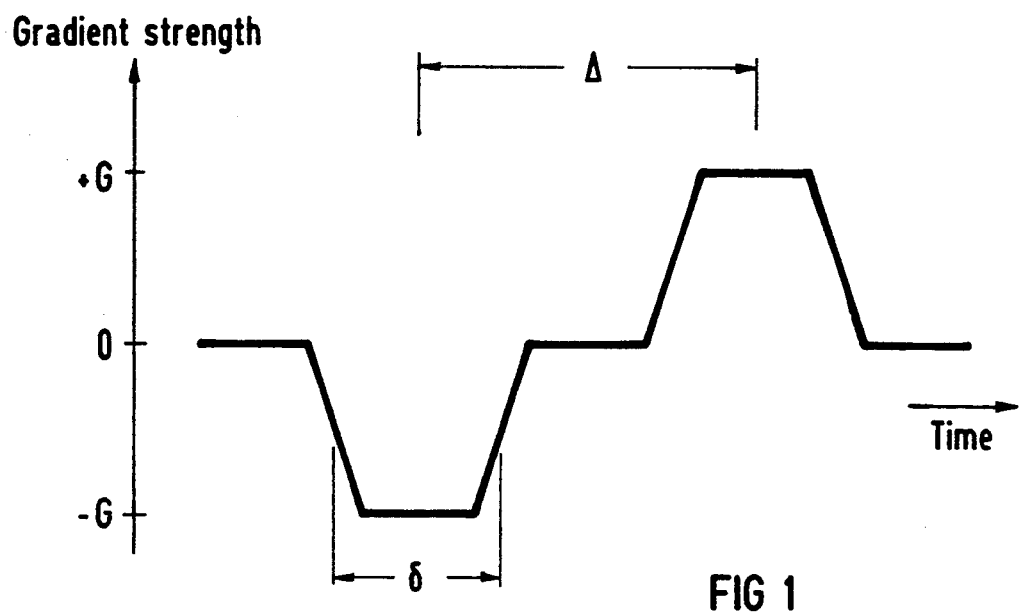
FIG. 1 shows an exemplary phase encoding pulse.

The phase shift introduced in the transverse magnetization for spins at a position $X(t)$ is given by:

$$\Phi(t) = \gamma \int_o^t G(t') \times (t')dt' \quad (1)$$

where
- $\Phi(t)$ = the phase shift,
- $\gamma$ = the gyromagnetic ratio,
- $G(t)$ = the gradient field amplitude at time t and
- $x(t)$ = the location of the spin at time t.

By expanding the coordinate $x(t)$ of the spin into a Taylor series we can divide the phase $\Phi$ into different components:

$$\Phi(t) = \Phi s(t) + \Phi v(t) + \Phi a(t) + \quad (2)$$

where $$\Phi s(t) = \gamma x_o \int_o^t G(t')dt' \quad (3)$$

$$\Phi v(t) = \frac{\gamma v_o}{2} \int_o^t G(t')t'dt' \quad (4)$$

$$\Phi a(t) = \frac{\gamma a_o}{3} \int_o^t G(t')t'^2 dt' \quad (5)$$

These are the phase shift terms corresponding, respectively, to stationary spins at position $x_o$, spins moving with constant velocity $v_o$ along the direction of the gradient G, and spins with constant acceleration $a_o$. The concept of flow encoding is based on the following idea:

A symmetric bipolar gradient pulse as shown in FIG. 1 (that is a gradient pulse with a positive and negative lobe having the same gradient integral) does not affect the phase of stationary spins. It does affect, however, the phase of moving spins. The effect of a gradient having the amplitude G, a time separation $\Delta$ between positive and negative lobes and a duration $\delta$ of each gradient lobe, is a velocity dependent phase shift $\Phi v$, which at an echo time Te, is given by $$\Phi v(Te) = \gamma v G \Delta \delta \quad (6)$$

It is pointed out that only velocity components v along the direction of the gradient G affect the phase shift. If higher order motion is not present, the phase shift of the transverse magnetization at each echo point is directly related to the flow velocity. Assuming constant velocity, gradient amplitude, separation and duration of the gradient lobes, we can simplify equation 6 as $$\Phi v(Te) = c \, v \quad (7)$$

where c is constant.

Figure 2:
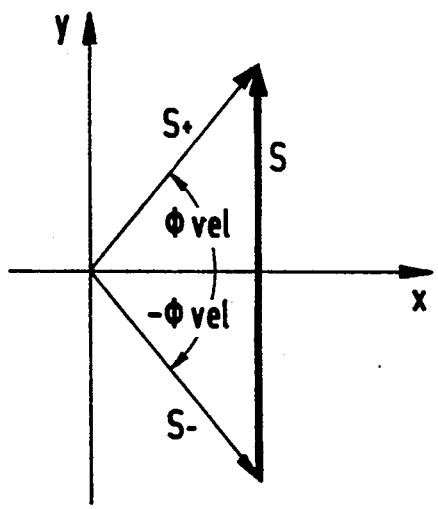
FIG. 2 shows resultant transverse magnetization signal vectors.

If the bipolar pulse is inverted (positive and negative gradient lobes changing their position) the sign of the phase shift of the transverse magnetization is inverted. This is indicated in FIG. 2, where $S^+$ indicates the signal obtained by phase encoding in a positive direction and $S^-$ indicates the signal obtained by phasing encoding in the negative direction. Flow encoding in the positive direction causes a positive phase shift $\Phi v$ and flow encoding in the negative direction causes a negative phase shift $-\Phi v$. If the raw data signals $S^+$ and $S^-$ are subtracted from each other, the magnitude of the difference S shown in FIG. 2 is a direct measure of the flow velocity. As long as the phase shift is less than $\pi/2$, the following relation for the modulus of S holds:

$$|S| = |S^+ - S^-| = 2 |S^+| \sin \Phi \quad (8)$$

where $\Phi = \Phi v(Te)$ and is given by equation 6. As indicated above, each flow encoding gradient only causes a phase shift corresponding to the velocity components in the direction of the gradient. If velocity components in all three spatial directions are to be measured, then three orthogonal phase encoding gradients must be applied.

A complete pulse sequence which is sensitive to flow in all three orthogonal spatial directions is shown in FIGS. 3 to 6. In accordance with the principles of the invention, only four sequences are necessary to obtain all the raw data signals needed for the phase contrast flow imaging method of the present invention. These four sequences are indicated by the numbers 1, 2, 3, and 4 in FIGS. 3 to 6. Each sequence is based on the spin warp method well known in the art, as for example described in U.S. Pat. No. 4,506,222. It is pointed out, however, that the spin warp method is only used as a simple imaging method useful for explaining the basic principles of the invention, and in fact many other MR imaging pulse sequence can be used in conjunction with the phase encoding method of the present invention, in particular any 2D or 3D sequence.

According to the spin warp method, each sequence starts with an RF pulse. As the RF pulse is applied together with a slice selection gradient Gs in the X-direction according to FIG. 4, the excitation of spins is limited to a slice of the object. To compensate for the phase shift caused by the slice selection gradient Gs+, a negative gradient Gs. is applied after excitation.

As shown in FIG. 5, a phase encoding gradient $G_P$ is applied in the y-direction after excitation and before a signal is read out.

As shown in FIG. 6, before reading out a signal, a negative lobe Gro$^-$ of a read out gradient Gro is switched on to dephase the spins, and therefore the positive lobe Gro$^+$ of the read out gradient Gro causes an echo signal S. This signal is sampled and used as a raw data signal.

In normal non-angiography imaging, the sequence described above would be repeated n times, each time with a different amplitude of the phase encoding gradient Gp. For each amplitude for the phase encoding gradient Gp the signal is sampled n times and written into a row of a raw data matrix. Thereby a raw data matrix of m rows and n columns is produced. By two dimensional Fourier-transformations, an image of the spin density within the selected slice is obtained.

According to the present invention, and as shown in FIGS. 4 to 6, flow encoding gradients Gf are applied in the three orthogonal directions x, y, and z. As shown in FIG. 1 and explained above, each flow encoding gradient is a bipolar gradient having positive and negative lobes with the same gradient integral. As also explained above, a phase encoding gradient where the first gradient lobe is negative and the second one is positive (which we will call a positive phase encoding gradient for explanation) has an inverted sign of phase shift as compared to a flow encoding gradient where the first gradient lobe is positive and the second one is negative (which we will call a negative flow encoding gradient for explanation). During the first sequence shown in FIGS. 3 to 6, all three flow encoding gradients in the x, y, and z directions are positive. In the second sequence, the flow encoding gradients Gf in the x and y directions are positive, whereas the flow encoding gradient Gf in the z direction is negative. In the third sequence, the flow encoding gradients Gf in the x and z directions are positive, whereas the flow encoding gradient Gf in the y direction is negative, and in the fourth sequence the flow encoding gradient Gf in the x direction is negative, while the flow encoding gradients Gf in the y and z directions are positive. Based on equation 7 above, the phase shift caused during sequences 1 to 4 are as follows, respectively:

$$\Phi 1 = cv(x) + cv(y) + cv(z) + \Phi 0 \tag{9}$$

$$\Phi 2 = cv(x) + cv(y) - cv(z) + \Phi 0 \tag{10}$$

$$\Phi 3 = cv(x) - cv(y) + cv(z) + \Phi 0 \tag{11}$$

$$\Phi 4 = -cv(x) + cv(y) + cv(z) + \Phi 0 \tag{12}$$

where $\Phi 0$ represents a potential constant phase shift related to the inhomogeneities of the static field.

The velocity components v(x), v(y) and v(z) in the x, y, and z directions are obtained by subtracting the signals obtained from the four sequences as follows:

$$\Phi_1 - \Phi_2 = 2cv(z) \tag{13}$$

$$\Phi_1 - \Phi_3 = 2cv(y) \tag{14}$$

$$\Phi_1 - \Phi_4 = 2cv(x) \tag{15}$$

This method provides a particularly good flow sensitivity due to the factor of 2 in the above equations.

The sensitivity of the sequence to a particular flow velocity range is an important feature of phase contrast angiography. Therefore, the parameters (i.e., amplitude) of flow encoding gradient pulses must be chosen in such a way that the flow phase for the maximal expected velocity component within the voxel is smaller than 180°. Otherwise the signal from flowing spins will decrease with increasing velocity as the flow phase exceeds 180°; leading to a reduced vascular signal at the increased velocities.

Figure 11:
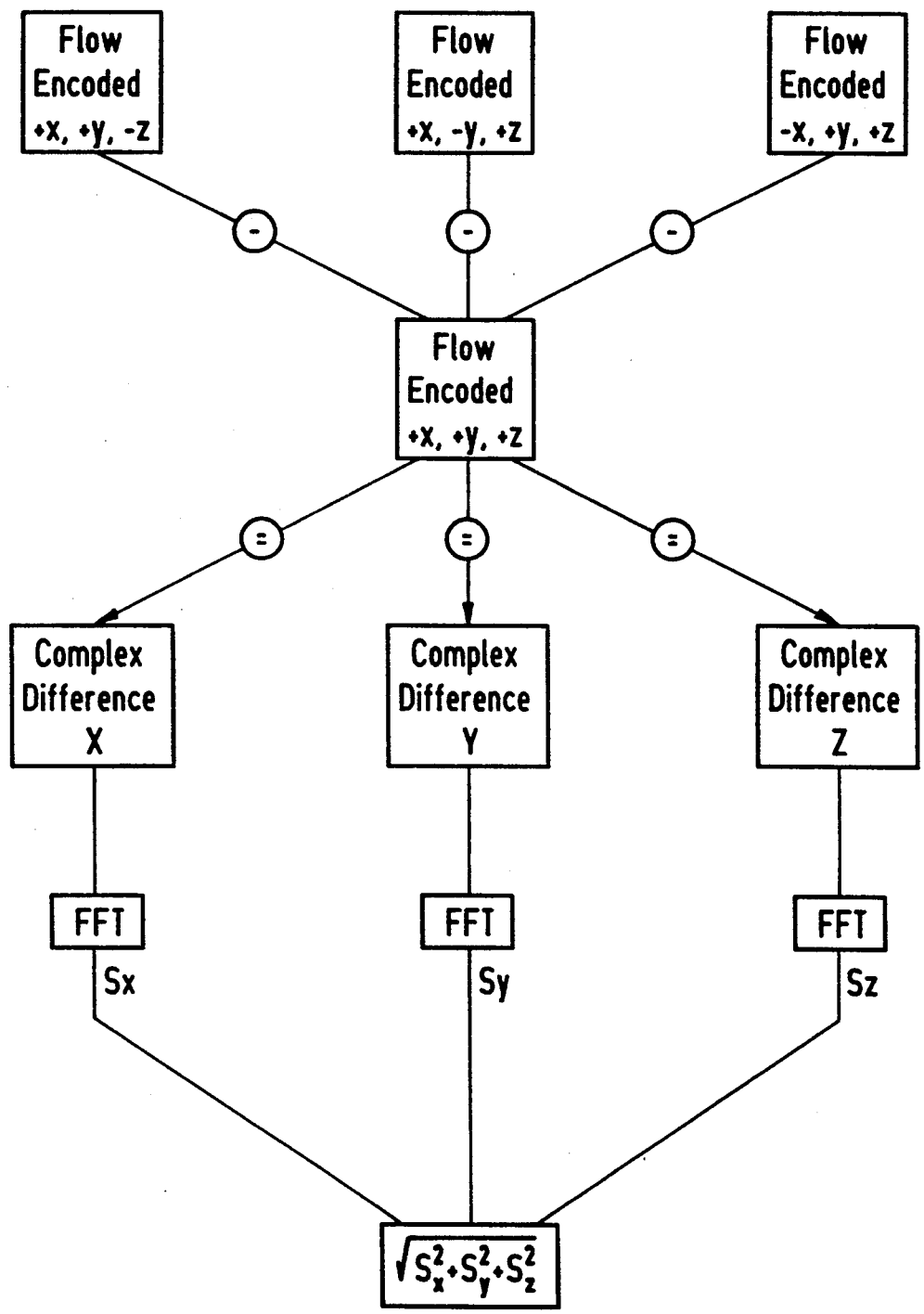
FIG. 11 shows a simplified reconstruction scheme.

A simplified reconstruction scheme for producing three-dimensional phase contrast data is shown in FIG. 11. As explained above, signals which are flow encoded in positive or negative x, y, and z directions are complex subtracted from a signal which is flow encoded in a positive x, positive y, and positive z direction. The complex difference represents x, y, and z velocity components, respectively, of moving spins. After subtraction, each complex difference is Fourier-transformed for providing directional components Sx, Sy and Sz. The final magnitude images are then added voxel-by-voxel by taking the square root of sum of the squares of each directional component to obtain the final set of flow data.

It is noted that the subtraction of data sets for providing phase-information must not necessarily be applied to the date sets before Fourier-transformation. Any complex data sets can be subtracted, for example the Fourier-transformation can be applied directly to the flow encoded raw data signals S of FIG. 6.

A specific advantage of the present invention resides in the fact that only two data buffer memories are necessary for calculating the phase shift at any given time. One memory holds the signal S of the first sequence of FIG. 6 and the other memory alternately holds one of the signals of the following sequences. As it will be understood from equations 13 to 15, no other signals are necessary for providing flow information in the three orthogonal directions.

In FIGS. 3 to 6, the flow encoding gradients $G_f$ are shown separately for explanation. In practice, however, all gradients simplify the control scheme for the gradient power supply, and to save time. FIGS. 7 to 10 show four pulse sequences where the negative lobe of the slice selection gradient GS− and the negative lobe of the read out gradient Gro− are superimposed on the flow encoding gradient Gf on the same axis. The resulting gradient is obtained simply by adding the gradient integrals of the corresponding gradients. The effect of the pulse sequences shown in FIGS. 7 to 10 is identical to that explained in connection with FIGS. 3 to 6.

Thus, there has been shown and described a novel method for obtaining data in phase contrast MR angiography. Many changes, modifications, variations and other uses and applications of the subject invention will, however, become apparent to those skilled in the art after considering this specification and its accompanying drawings which disclose preferred embodiments thereof. All such changes, modifications, variations and other uses and applications which do not depart from the spirit and scope of the invention are deemed to be covered by the invention which is limited only by the claims which follow.

We claim:

1. A method for obtaining data for phase-contrast MR angiography, which method is sensitive to flow in a sample in three orthogonal directions, comprising:
   a sequence with four steps:
      a first step comprising excitation of spins in said sample and flow encoding said spins in a positive direction;
      three further steps whereby in each further step flow encoding of said spins is inverted in one of said orthogonal directions and positive in the other two directions, and said one direction is a different one of said three directions in each of said three further steps;
      sampling the signals obtained during each of said above four steps; and
      obtaining a raw data set for each of said orthogonal directions by complex subtraction of the signals obtained by one of said further steps and of the signals obtained by said first step.

2. The method of claim 1, wherein:
   during excitation in each of said four steps, a slice selection gradient is switched on in a first one of said three directions.

3. The method of claim 1, wherein:
   before said step of sampling said signal, a phase encoding gradient in a second one of said directions is switched on.

4. The method of claim 1, wherein:
   during said step of sampling said signals, a read-out gradient in a third one of said three directions is switched on.

5. The method of claim 3, wherein:
   the sequence is repeated n times, said phase encoding gradient having a different time-integral each time said sequence is repeated.

6. The method of claim 1, wherein:

the raw data sets are Fourier-transformed and each voxel of a magnitude image is obtained by taking the square root of the sum of the squares of the corresponding components in the three directions for each voxel.

7. The method of claim 1, wherein:
said flow encoding in each direction is obtained by a gradient in that direction which has a positive and a negative lobe, both lobes having the same time-integral.

* * * * *